(12) United States Patent
Miyashita et al.

(10) Patent No.: US 11,456,106 B2
(45) Date of Patent: Sep. 27, 2022

(54) INDUCTOR COMPONENT AND POWER SUPPLY MODULE

(71) Applicant: Murata Manufacturing Co., Ltd., Nagaokakyo (JP)

(72) Inventors: Munetake Miyashita, Nagaokakyo (JP); Takayuki Tange, Nagaokakyo (JP); Hideaki Hashi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 904 days.

(21) Appl. No.: 16/269,587

(22) Filed: Feb. 7, 2019

(65) Prior Publication Data
US 2019/0189334 A1 Jun. 20, 2019

Related U.S. Application Data

(63) Continuation of application No. PCT/JP2017/030482, filed on Aug. 25, 2017.

(30) Foreign Application Priority Data

Sep. 2, 2016 (JP) .............................. JP2016-171464

(51) Int. Cl.
H01F 27/29 (2006.01)
H01F 27/28 (2006.01)
(Continued)

(52) U.S. Cl.
CPC ......... H01F 27/2804 (2013.01); H01F 17/00 (2013.01); H01F 17/04 (2013.01);
(Continued)

(58) Field of Classification Search
CPC ...... H01F 27/29; H01F 27/24; H01F 27/2804; H05K 2201/1003
See application file for complete search history.

(56) References Cited

U.S. PATENT DOCUMENTS

| | | | |
|---|---|---|---|
| 2010/0148905 A1 | 6/2010 | Matsumoto | |
| 2014/0218147 A1* | 8/2014 | Chatani | H01F 17/0013 336/20 |

(Continued)

FOREIGN PATENT DOCUMENTS

| | | |
|---|---|---|
| CN | 101752066 A | 6/2010 |
| CN | 103971892 A | 8/2014 |

(Continued)

OTHER PUBLICATIONS

Official Communication issued in International Patent Application No. PCT/JP2017/030482, dated Oct. 31, 2017.

(Continued)

*Primary Examiner* — Sherman Ng
(74) *Attorney, Agent, or Firm* — Keating & Bennett, LLP

(57) ABSTRACT

An inductor component includes cores, a coil disposed in the cores, and terminal electrodes. The coil includes first metal plates disposed on an upper surface of the cores, second metal plates disposed on a lower surface of the cores, and a plurality of metal pins each passing through one of the cores in a thickness direction. The coil has a helical shape by connecting the first metal plates to the second metal plates, with the plurality of metal pins therebetween. The terminal electrodes are spaced apart along a direction in which the helical shape extends, and are connected to the coil.

19 Claims, 4 Drawing Sheets

(51) Int. Cl.
- *H02M 3/155* (2006.01)
- *H01F 37/00* (2006.01)
- *H05K 1/18* (2006.01)
- *H02M 3/28* (2006.01)
- *H01F 17/04* (2006.01)
- *H01F 17/00* (2006.01)
- *H01F 27/24* (2006.01)
- *H02M 7/00* (2006.01)
- *H02M 3/335* (2006.01)

(52) U.S. Cl.
CPC ............ *H01F 27/24* (2013.01); *H01F 27/29* (2013.01); *H01F 37/00* (2013.01); *H02M 3/155* (2013.01); *H02M 3/28* (2013.01); *H02M 7/003* (2013.01); *H05K 1/18* (2013.01); *H05K 1/181* (2013.01); *H01F 2027/2809* (2013.01); *H02M 3/335* (2013.01); *H05K 2201/1003* (2013.01); *H05K 2201/10053* (2013.01)

(56) References Cited

U.S. PATENT DOCUMENTS

| | | | |
|---|---|---|---|
| 2015/0235753 A1* | 8/2015 | Chatani | H01F 17/0033 336/200 |
| 2018/0366258 A1* | 12/2018 | Otsubo | H01F 41/04 |
| 2019/0189334 A1 | 6/2019 | Miyashita et al. | |

FOREIGN PATENT DOCUMENTS

| | | |
|---|---|---|
| CN | 104603889 A | 5/2015 |
| JP | 2000-040620 A | 2/2000 |
| JP | 2013-243330 A | 12/2013 |
| JP | 2014-168038 A | 9/2014 |
| JP | 2016-046390 A | 4/2016 |
| JP | 6662461 B2 | 3/2020 |

OTHER PUBLICATIONS

Official Communication issued in corresponding Chinese Patent Application No. 201780052496.9, dated Dec. 11, 2020.

* cited by examiner

INDUCTOR COMPONENT AND POWER SUPPLY MODULE

CROSS REFERENCE TO RELATED APPLICATIONS

This application claims the benefit of priority to Japanese Patent Application No. 2016-171464 filed on Sep. 2, 2016 and is a Continuation Application of PCT Application No. PCT/JP2017/030482 filed on Aug. 25, 2017. The entire contents of each of the above-identified applications are hereby incorporated herein by reference.

BACKGROUND OF THE INVENTION

1. Field of the Invention

The present invention relates to an inductor component including a plurality of inductors, and a power supply module including the inductor component.

2. Description of the Related Art

Various types of inductor components are currently used. For example, an inductor component disclosed in Japanese Unexamined Patent Application Publication No. 2000-40620 includes a core substrate and a coil. The core substrate is formed, for example, by a printed circuit board. The coil is formed by a conductor and includes an upper-side wiring pattern, a lower-side wiring pattern, and interlayer connection conductors. The upper-side wiring pattern and the lower-side wiring pattern are printed patterns.

The upper-side wiring pattern is formed on the upper surface of the core substrate, and the lower-side wiring pattern is formed on the lower surface of the core substrate. The upper-side wiring pattern and the lower-side wiring pattern are connected by the interlayer connection conductors to form a helical coil.

Because of the sophistication of electronic devices in recent years, the inductor component with the configuration described above may not be able to provide satisfactory characteristics.

In the configuration of the inductor component described above, one inductor component includes only one inductor. This means that for an electronic device which requires a plurality of inductors, as many inductor components as required for the electronic device need to be prepared. In this case, due to characteristic variation among inductor components, a module which uses a plurality of inductor components may not be able to achieve required characteristics.

SUMMARY OF THE INVENTION

Preferred embodiments of the present invention provide inductor components each including a plurality of inductors, enable each inductor of the plurality of inductors to achieve good inductor characteristics, and reduce characteristic variation among the plurality of inductors.

An inductor component according to a preferred embodiment of the present invention includes a core including an upper surface and a lower surface; a coil disposed in the core; and a first terminal electrode, a second terminal electrode, and a third terminal electrode. The coil includes a first metal plate disposed on the upper surface of the core, a second metal plate disposed on the lower surface of the core, and a plurality of metal pins passing through the core in a thickness direction. The coil has a helical shape provided by connecting the first metal plate to the second metal plate, with the plurality of metal pins therebetween. The first terminal electrode, the second terminal electrode, and the third terminal electrode are spaced apart along a direction in which the helical shape of the coil extends, and are connected to the coil.

This configuration, in which the coil includes the metal plates and the metal pins integrally provided, reduces variation among inductor components and improves characteristics, such as DCR. A first inductor is disposed between the first terminal electrode and the second terminal electrode, and a second inductor is disposed between the second terminal electrode and the third terminal electrode. The above-described structure enables a plurality of inductors to be integrally provided, and the structure is able to be formed by metal molding, for example. This reduces characteristic variation between the plurality of inductors.

An inductor component according to a preferred embodiment of the present invention may be configured as follows. The core is divided into a plurality of portions, which are spaced apart in a direction parallel or substantially parallel to the upper surface and the lower surface.

With this configuration, a plurality of inductors which are not coupled together by a magnetic field are integrally provided.

An inductor component according to a preferred embodiment of the present invention may be configured as follows. The core is not divided.

With this configuration, a plurality of inductors which are coupled together by a magnetic field are integrally provided.

An inductor component according to a preferred embodiment of the present invention is preferably configured as follows. The first terminal electrode, the second terminal electrode, and the third terminal electrode are columnar electrodes connected to the second metal plate and extending in a direction orthogonal or substantially orthogonal to the lower surface of the core.

This configuration improves mountability of the inductor component.

A power supply module according to a preferred embodiment of the present invention includes an inductor component described above, a circuit board including a predetermined pattern provided thereon, a power supply control IC, and a switching element. The inductor component, the power supply control IC, and the switching element are mounted on the circuit board. The switching element is disposed near one of the first terminal electrode, the second terminal electrode, and the third terminal electrode of the inductor component, the one being a terminal electrode to which the switching element is connected.

This configuration reduces the connection distance between the inductor component and the switching element.

In a power supply module according to a preferred embodiment of the present invention, it is preferable that the switching element and the inductor component be at least partially superimposed in plan view.

This configuration reduces the planar area of the power supply module.

Preferred embodiments of the present invention reduce variation among inductor components, improve characteristics such as DCR, and reduce characteristic variation between a plurality of inductors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Inductor components according to preferred embodiments of the present invention will be described with reference to the drawings.

Figure 1:
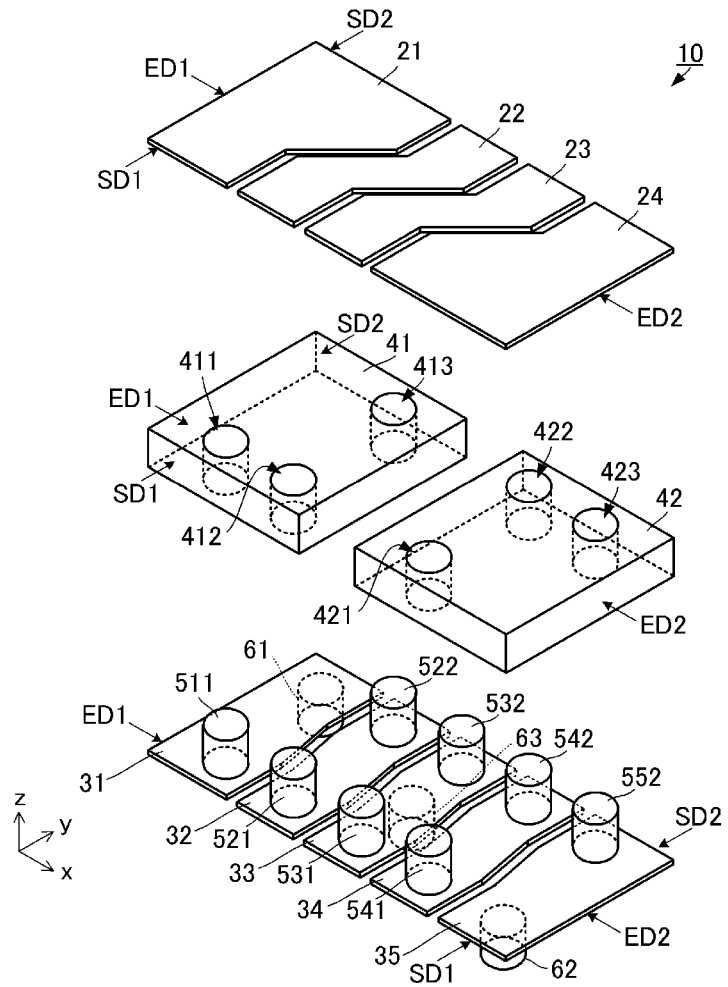
FIG. 1 is an exploded perspective view of an inductor component according to a first preferred embodiment of the present invention.
Figure 2:
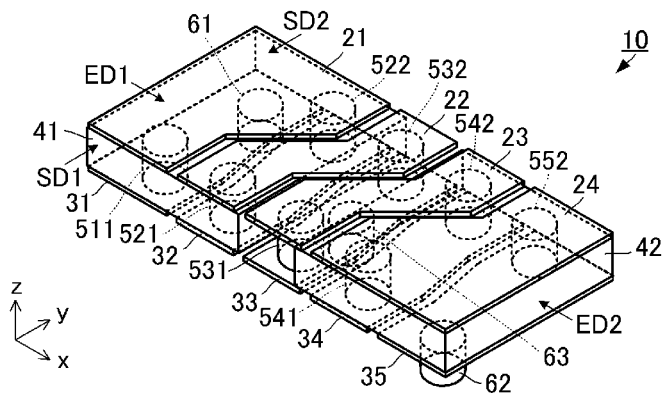
FIG. 2 is an external perspective view of the inductor component according to the first preferred embodiment of the present invention.

An inductor component according to a first preferred embodiment of the present invention will be described with reference to the drawings. FIG. 1 is an exploded perspective view of the inductor component according to the first preferred embodiment of the present invention. FIG. 2 is an external perspective view of the inductor component according to the first preferred embodiment of the present invention.

As illustrated in FIGS. 1 and 2, an inductor component 10 includes first metal plates 21, 22, 23, and 24, second metal plates 31, 32, 33, 34, and 35, cores 41 and 42, metal pins 511, 521, 522, 531, 532, 541, 542, and 552, and terminal electrodes 61, 62, and 63.

The cores 41 and 42 have a rectangular or substantially rectangular parallelepiped shape including upper and lower surfaces. The cores 41 and 42 are preferably, for example, resin substrates. The cores 41 and 42 do not necessarily need to be resin substrates, as long as they are made of a material having a predetermined relative magnetic permeability. It is preferable, however, that the cores 41 and 42 be made of a material which enables easy formation of through-holes therein.

The core 41 and the core 42 are spaced apart in the x-direction in FIGS. 1 and 2. In other words, the core 41 and the core 42 are provided by dividing one core in the middle in the x-direction. The core 41 is disposed on the side of a first end surface ED1 of the inductor component 10, and the core 42 is disposed on the side of a second end surface ED2 of the inductor component 10. A first side surface SD1 of the core 41 is flush or substantially flush with a first side surface SD1 of the core 42, and a second side surface SD2 of the core 41 is flush or substantially flush with a second side surface SD2 of the core 42.

The core 41 includes through-holes 411, 412, and 413 therethrough from the upper surface thereof to the lower surface thereof. The through-holes 411 and 412 are provided near the first side surface SD1 of the core 41 and spaced apart in a direction parallel or substantially parallel to the first side surface SD1 (i.e., in the x-direction in FIGS. 1 and 2). The through-hole 413 is provided near the second side surface SD2 of the core 41. In the x-direction, the position of the through-hole 412 is the same or substantially the same as the position of the through-hole 413. The through-hole 411 is provided on a side of the core 41 adjacent to the first end surface ED1 in the x-direction, and the through-holes 412 and 413 are provided on the other side of the core 41 adjacent to the second end surface ED2 in the x-direction.

The core 42 includes through-holes 421, 422, and 423 therethrough from the upper surface thereof to the lower surface thereof. The through-hole 421 is provided near the first side surface SD1 of the core 42. The through-holes 422 and 423 are provided near the second side surface SD2 of the core 42 and spaced apart in a direction parallel or substantially parallel to the first side surface SD1 (i.e., in the x-direction in FIGS. 1 and 2). In the x-direction, the position of the through-hole 421 is the same or substantially the same as the position of the through-hole 422. The through-holes 421 and 422 are provided on a side of the core 42 adjacent to the first end surface ED1 in the x-direction, and the through-hole 423 is provided on the other side of the core 42 adjacent to the second end surface ED2 in the x-direction.

The first metal plates 21, 22, 23, and 24 are disposed on the upper surface of the cores 41 and 42, and more specifically, in the upper plane of a rectangular or substantially rectangular parallelepiped region occupied by the cores 41 and 42. The first metal plate 21, the first metal plate 22, the first metal plate 23, and the first metal plate 24 are disposed in this order along the x-direction, from the first end surface ED1 toward the second end surface ED2 of the inductor component 10. The first metal plate 21, the first metal plate 22, the first metal plate 23, and the first metal plate 24 are spaced apart from each other. The first metal plate 21 is narrower on the side of the first side surface SD1 than on the side of the second side surface SD2. The first metal plate 24 is wider on the side of the first side surface SD1 than on the side of the second side surface SD2. The first metal plates 22 and 23 have a uniform or substantially uniform width in an extension direction in which they extend. The first metal plates 22 and 23 bend in the middle in the extension direction.

The second metal plates 31, 32, 33, 34, and 35 are disposed on the lower surface of the cores 41 and 42, and more specifically, in the lower plane of the rectangular parallelepiped region occupied by the cores 41 and 42. The second metal plate 31, the second metal plate 32, the second metal plate 33, the second metal plate 34, and the second metal plate 35 are arranged in this order along the x-direction, from the first end surface ED1 toward the second end surface ED2 of the inductor component 10. The second metal plate 31, the second metal plate 32, the second metal plate 33, the second metal plate 34, and the second metal plate 35 are spaced apart from each other. The second metal plate 31 is wider on the side of the first side surface SD1 than on the side of the second side surface SD2. The second metal plate 35 is narrower on the side of the first side surface SD1 than on the side of the second side surface SD2. The second metal plates 32, 33, and 34 have a uniform or substantially uniform width in an extension direction in which they extend. The second metal plates 32, 33, and 34 bend in the middle in the extension direction.

The metal pin 511 is inserted in the through-hole 411. The metal pin 511 connects a predetermined position in the second metal plate 31 adjacent to the first side surface SD1 to a predetermined position in the first metal plate 21 adjacent to the first side surface SD1.

The metal pin 522 is inserted in the through-hole 413. The metal pin 522 connects a predetermined position in the first metal plate 21 adjacent to the second side surface SD2 to a predetermined position in the second metal plate 32 adjacent to the second side surface SD2.

The metal pin 521 is inserted in the through-hole 412. The metal pin 521 connects a predetermined position in the second metal plate 32 adjacent to the first side surface SD1 to a predetermined position in the first metal plate 22 adjacent to the first side surface SD1.

The metal pin 532 is inserted in the gap between the core 41 and the core 42. The metal pin 532 connects a predetermined position in the first metal plate 22 adjacent to the second side surface SD2 to a predetermined position in the second metal plate 33 adjacent to the second side surface SD2.

The metal pin 531 is inserted in the gap between the core 41 and the core 42. The metal pin 531 connects a predetermined position in the second metal plate 33 adjacent to the first side surface SD1 to a predetermined position in the first metal plate 23 adjacent to the first side surface SD1.

The metal pin 542 is inserted in the through-hole 422. The metal pin 542 connects a predetermined position in the first metal plate 23 adjacent to the second side surface SD2 to a predetermined position in the second metal plate 34 adjacent to the second side surface SD2.

The metal pin 541 is inserted in the through-hole 421. The metal pin 541 connects a predetermined position in the second metal plate 34 adjacent to the first side surface SD1 to a predetermined position in the first metal plate 24 adjacent to the first side surface SD1.

The metal pin 552 is inserted in the through-hole 423. The metal pin 552 connects a predetermined position in the first metal plate 24 adjacent to the second side surface SD2 to a predetermined position in the second metal plate 35 adjacent to the second side surface SD2.

This configuration enables the first metal plates 21, 22, 23, and 24, the second metal plates 31, 32, 33, 34, and 35, and the metal pins 511, 521, 522, 531, 532, 541, 542, and 552 to define a helical coil. The cores 41 and 42 are entirely or substantially entirely disposed inside the coil. The cores 41 and 42 may be partially disposed outside the coil.

The inductor component 10 thus provides a configuration in which a first inductor including the core 41 and a second inductor including the core 42 are integrally provided. This provides the inductor component 10 in which variation in characteristics, such as DCR, between the first inductor and the second inductor is reduced. The characteristic variation between the first inductor and the second inductor is further reduced particularly when the first metal plates 21, 22, 23, and 24, the second metal plates 31, 32, 33, 34, and 35, and the metal pins 511, 521, 522, 531, 532, 541, 542, and 552 are molded in a metal mold or are integrally provided.

This configuration is able to reduce the resistivity of the first metal plates 21, 22, 23, and 24, the second metal plates 31, 32, 33, 34, and 35, and the metal pins 511, 521, 522, 531, 532, 541, 542, and 552, and is able to reduce the DCR of the inductor component 10. This enables both of the first inductor and the second inductor to achieve good inductor characteristics.

The terminal electrodes 61, 62, and 63 preferably have a columnar shape, similar to the metal pins described above. The terminal electrode 61 is provided on a surface of the second metal plate 31 opposite the core 41. The terminal electrode 61 is provided near the second side surface SD2 of the second metal plate 31. The terminal electrode 62 is provided on a surface of the second metal plate 35 opposite the core 42. The terminal electrode 62 is provided near the first side surface SD1 of the second metal plate 35. The terminal electrode 63 is provided on a surface of the second metal plate 33 opposite the cores 41 and 42. The terminal electrode 63 is provided in the middle of the second metal plate 33 in a direction in which the second metal plate 33 extends.

This configuration enables the terminal electrodes 61 and 63 to define and function as terminals of the first inductor including the core 41, and enables the terminal electrodes 62 and 63 to define and function as terminals of the second inductor including the core 42. This configuration improves mountability of the inductor component 10, because the terminal electrodes 61, 62, and 63 protrude from the back surface of the inductor component 10 in a direction (z-direction) orthogonal or substantially orthogonal to the back surface.

Structuring the terminal electrodes 61, 62, and 63 similarly to the metal pins reduces the resistivity of the terminal electrodes 61, 62, and 63.

The terminal electrodes 61, 62, and 63 are only required to be disposed at intervals in the order of the terminal electrode 61, the terminal electrode 63, and the terminal electrode 62 along the direction in which the helical coil extends. That is, by appropriately positioning the terminal electrode 61, the terminal electrode 63, and the terminal electrode 62, the first inductor and the second inductor are able to be adjusted to a desired inductance value.

Although the terminal electrodes 61, 62, and 63 are provided on the back surface of the inductor component 10 in the preferred embodiment described above, a portion of the terminal electrodes 61, 62, and 63 (e.g., terminal electrode 62) may be provided on the front surface of the inductor component 10.

Figure 3:
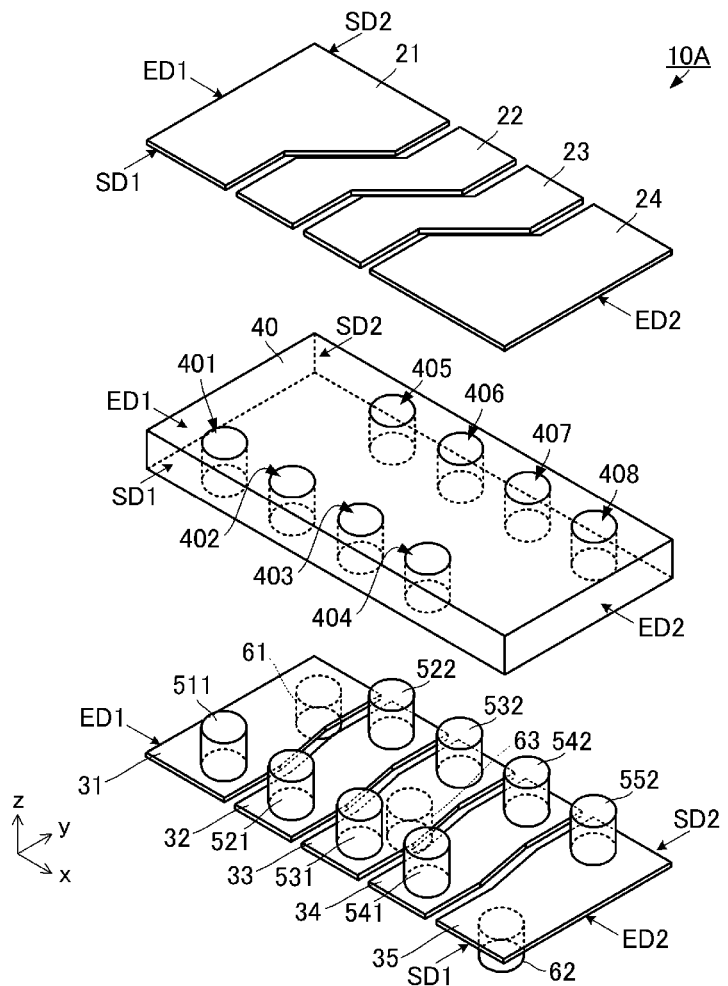
FIG. 3 is an exploded perspective view of an inductor component according to a second preferred embodiment of the present invention.
Figure 4:
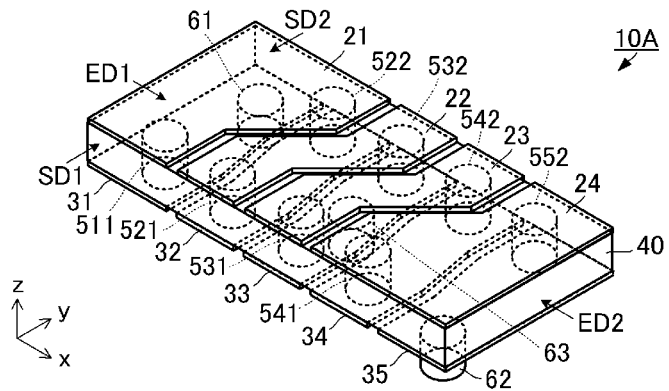
FIG. 4 is an external perspective view of the inductor component according to the second preferred embodiment of the present invention.

An inductor component according to a second preferred embodiment of the present invention will be described with reference to the drawings. FIG. 3 is an exploded perspective view of the inductor component according to the second preferred embodiment of the present invention. FIG. 4 is an external perspective view of the inductor component according to the second preferred embodiment of the present invention.

An inductor component 10A according to the present preferred embodiment differs from the inductor component 10 according to the first preferred embodiment in that the inductor component 10A includes only one core 40. Other than that, the inductor component 10A has the same or substantially the same configuration as the inductor component 10 of the first preferred embodiment, and the description of the same portions will be omitted.

The core 40 has a rectangular or substantially rectangular parallelepiped shape with upper and lower surfaces. The core 40 extends continuously from the first end surface ED1 to the second end surface ED2 of the inductor component 10A.

The core 40 includes through-holes 401, 402, 403, 404, 405, 406, 407, and 408 therethrough from the upper surface thereof to the lower surface thereof. The through-holes 401, 402, 403, and 404 are provided near the first side surface SD1 of the core and spaced apart in a direction parallel or substantially parallel to the first side surface SD1 (i.e., in the x-direction in FIGS. 3 and 4). The through-holes 401, 402, 403, and 404 are disposed in this order along the x-direction, from the first end surface ED1 toward the second end surface ED2.

The through-holes 405, 406, 407, and 408 are provided near the second side surface SD2 of the core 40 and spaced apart in a direction parallel or substantially parallel to the second side surface SD2 (i.e., in the x-direction in FIGS. 3 and 4). The through-holes 405, 406, 407, and 408 are disposed in this order along the x-direction, from the first end surface ED1 toward the second end surface ED2.

The metal pin 511 is inserted in the through-hole 401, the metal pin 521 is inserted in the through-hole 402, the metal pin 531 is inserted in the through-hole 403, and the metal pin 541 is inserted in the through-hole 404.

The metal pin 522 is inserted in the through-hole 405, the metal pin 532 is inserted in the through-hole 406, the metal pin 542 is inserted in the through-hole 407, and the metal pin 552 is inserted in the through-hole 408.

With this configuration, the first inductor including the terminal electrode 61 and the terminal electrode 63 as input and output terminals and the second inductor including the terminal electrode 62 and the terminal electrode 63 as input and output terminals are integrally provided. The first inductor and the second inductor are coupled by a magnetic field. That is, the inductor component 10A provides a configuration in which the first inductor and the second inductor coupled by a magnetic field are integrally provided. Even with this configuration having magnetic field coupling, characteristic variation between the first inductor and the second inductor is able to be reduced and both of the first inductor and the second inductor are able to achieve good inductor characteristics, as in the case of the inductor component 10 of the first preferred embodiment.

Figure 5:
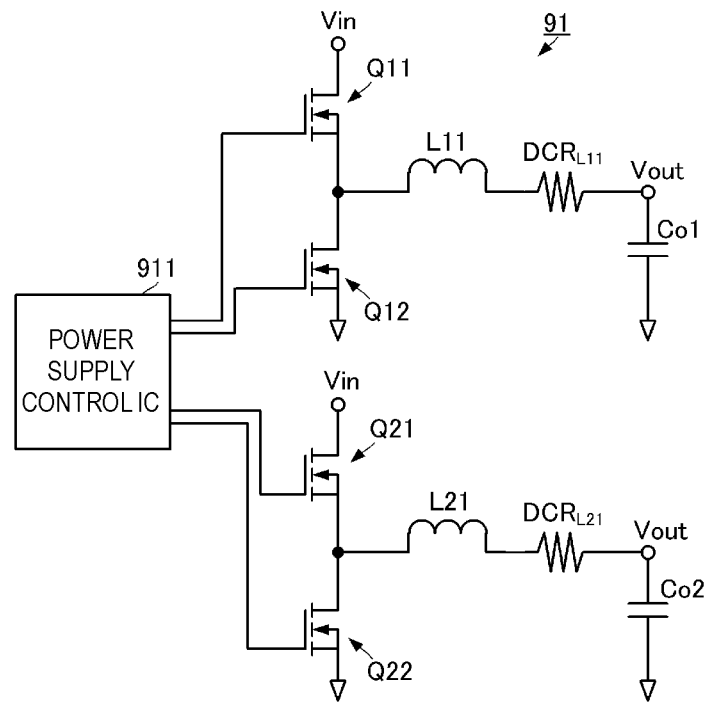
FIG. 5 is a circuit diagram of a power supply module according to a third preferred embodiment of the present invention.

A power supply module according to a third preferred embodiment of the present invention will now be described with reference to FIG. 5. FIG. 5 is a circuit diagram of the power supply module according to the third preferred embodiment.

As illustrated in FIG. 5, a power supply module 91 includes a power supply control IC 911, switching elements Q11, Q12, Q21, and Q22, inductors L11 and L21, and output capacitors Co1 and Co2. The inductor L11 and the inductor L21 each include a direct-current resistance (DCR) component. In an equivalent circuit, $DCR_{L11}$ of the inductor L11 is connected in series to the inductor L11, and $DCR_{L21}$ of the inductor L21 is connected in series to the inductor L21.

The switching element Q11 and the switching element Q12 are connected between a voltage input terminal Vin and the ground. The switching element Q11 and the switching element Q12 are connected to the power supply control IC 911. The switching element Q11 and the switching element Q12 are switching-controlled by the power supply control IC 911.

The inductor L11 is connected to a switching node to which the switching element Q11 and the switching element Q12 are connected, and the resulting series circuit is connected to a voltage output terminal Vout. The output capacitor Co1 is connected between the voltage output terminal Vout and the ground.

The switching element Q21 and the switching element Q22 are connected between a voltage input terminal Vin and the ground. The switching element Q21 and the switching element Q22 are connected to the power supply control IC 911. The switching element Q21 and the switching element Q22 are switching-controlled by the power supply control IC 911.

The inductor L21 is connected to a switching node to which the switching element Q21 and the switching element Q22 are connected, and the resulting series circuit is connected to a voltage output terminal Vout. The output capacitor Co2 is connected between the voltage output terminal Vout and the ground.

This configuration enables the power supply module 91 to provide a multiphase converter which includes a first power stage on the side of the inductor L11 and a second power stage on the side of the inductor L21. The inductor component 10 described above is used for the inductor L11 and the inductor L21. For example, the first inductor of the inductor component 10 defines and functions as the inductor L11, and the second inductor of the inductor component 10 defines and functions as the inductor L21.

This reduces variation in DCR between the inductor L11 and the inductor L21. Therefore, it is possible to improve accuracy of sensing a current in the inductor L11 and the inductor L21, maintain current balance between a plurality of power stages (multiple phases) with high accuracy, and improve the characteristics of the power supply module 91.

Since inductance variation between the inductor L11 and the inductor L21 is able to be reduced, it is possible to reduce variation in inductor current and improve the characteristics of the power supply module 91.

Using the inductor component 10 enables a large current to pass through the inductor L11 and the inductor L21 and makes it possible to support applications designed for large current.

Because of high flexibility in positioning the terminal electrodes 61 and 62, it is possible to reduce the distance between the switching node between the switching elements Q11 and Q12 and the inductor L11 and the distance between the switching node between the switching elements Q21 and Q22 and the inductor L21, and improve the resistance of the power supply module 91 to noise.

Also, it is possible to easily achieve commonality of the voltage output terminals Vout between the power stages and simplify the configuration of the power supply module 91.

Figure 6:
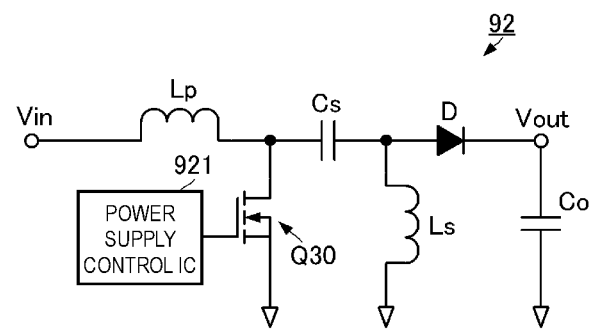
FIG. 6 is a circuit diagram of a power supply module according to a fourth preferred embodiment of the present invention.

A power supply module according to a fourth preferred embodiment of the present invention will now be described with reference to FIG. 6. FIG. 6 is a circuit diagram of the power supply module according to the fourth preferred embodiment.

As illustrated in FIG. 6, a power supply module 92 includes a power supply control IC 921, a switching element Q30, inductors Lp and Ls, a capacitor Cs, a diode D, and an output capacitor Co.

A series circuit of the inductor Lp, the capacitor Cs, and the inductor Ls is connected between the voltage input terminal Vin and the ground. The switching element Q30 is connected between a node between the inductor Lp and the capacitor Cs and the ground. The power supply control IC 921 is connected to the switching element Q30. The switching element Q30 is switching-controlled by the power supply control IC 921.

The anode of the diode D is connected to a node between the capacitor Cs and the inductor Ls, and the cathode of the diode D is connected to the voltage output terminal Vout. The output capacitor Co is connected between the voltage output terminal Vout and the ground.

This configuration enables the power supply module 92 to provide a SEPIC converter. The inductor component 10A described above is used for the inductor Lp and the inductor Ls. For example, the first inductor of the inductor component 10A defines and functions as the inductor Lp and the second inductor of the inductor component 10A defines and functions as the inductor Ls.

It is preferable that characteristic variation between the inductor Lp and the inductor Ls of the SEPIC converter be small. Using the inductor component 10A to provide the inductors Lp and Ls thus enables the power supply module 92 to achieve good characteristics.

Figure 7:
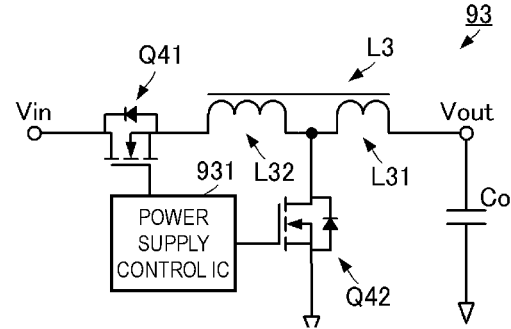
FIG. 7 is a circuit diagram of a power supply module according to a fifth preferred embodiment of the present invention.

A power supply module according to a fifth preferred embodiment of the present invention will now be described with reference to FIG. 7. FIG. 7 is a circuit diagram of the power supply module according to the fifth preferred embodiment.

As illustrated in FIG. 7, a power supply module 93 includes a power supply control IC 931, switching elements Q41 and Q42, an inductor L3, and the output capacitor Co. The inductor L3 includes an inductor L31 and an inductor L32 coupled to each other.

A series circuit of the switching element Q41, the inductor L32, and the switching element Q42 is connected between the voltage input terminal Vin and the ground. The power supply control IC 931 is connected to the switching elements Q41 and Q42. The switching elements Q41 and Q42 are switching-controlled by the power supply control IC 931. The inductor L32 is connected to the inductor L31 on a side thereof adjacent to the switching element Q42. In other words, the switching element Q42 is connected between a node between the inductor L32 and the inductor L31 and the ground. The inductor L31 is connected to the voltage output terminal Vout. The output capacitor Co is connected between the voltage output terminal Vout and the ground.

This configuration enables the power supply module 93 to provide a power supply module which includes a tapped inductor. The inductor component 10A described above is used for the inductor L3. For example, the second inductor of the inductor component 10A defines and functions as the inductor L31, and the first inductor of the inductor component 10A defines and functions as the inductor L32.

This configuration enables the power supply module 93 to easily provide a power supply module which offers high flexibility in setting a center tap position, that is, an inductance ratio between the inductor L32 and the inductor L31. Specifically, for example, by positioning the first metal plate, the second metal plate, and the terminal electrodes to set the winding ratio and the manner of winding of the first inductor and the second inductor, the inductance ratio between the inductor L32 and the inductor L31 is able to be flexibly and easily set. Using the inductor component 10A enables the power supply module 93 to be used in applications designed for large current. The power supply module 93 is able to be used in up-converters or down-converters which have a large difference in voltage between input and output.

Figure 8:
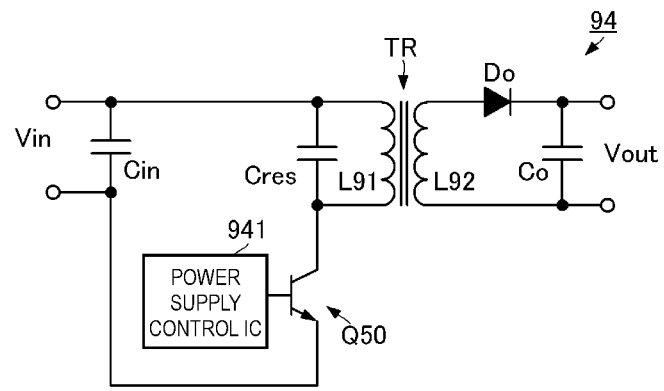
FIG. 8 is a circuit diagram of a power supply module according to a sixth preferred embodiment of the present invention.

A power supply module according to a sixth preferred embodiment of the present invention will now be described with reference to FIG. 8. FIG. 8 is a circuit diagram of the power supply module according to the sixth preferred embodiment.

As illustrated in FIG. 8, a power supply module 94 includes a power supply control IC 941, a switching element Q50, an isolated transformer TR, a resonance capacitor Cres, an output-side diode Do, an input capacitor Cin, and the output capacitor Co. The isolated transformer TR includes a primary coil L91 and a secondary coil L92.

A series circuit including the primary coil L91 of the isolated transformer TR and the switching element Q50 is connected between a first end and a second end of the voltage input terminal Vin. The resonance capacitor Cres is connected in parallel to the primary coil L91. The input capacitor Cin is connected between the first end and the second end of the voltage input terminal Vin. A first end of the voltage output terminal Vout is connected to one end of the secondary coil L92 of the isolated transformer TR, with the output-side diode Do therebetween, and a second end of the voltage output terminal Vout is connected to the other end of the secondary coil L92. The power supply control IC 941 is connected to the switching element Q50. The switching element Q50 is switching-controlled by the power supply control IC 941.

This configuration enables the power supply module 94 to provide an isolated DC converter. The inductor component 10A described above is used for the isolated transformer TR. For example, the first inductor of the inductor component 10A defines and functions as the primary coil L91, and the second inductor of the inductor component 10A defines and functions as the secondary coil L92.

This configuration enables the power supply module 94 to easily provide a power supply module which offers high flexibility in setting an inductance ratio between the primary coil L91 and the secondary coil L92. Specifically, for example, by positioning the first metal plate, the second metal plate, and the terminal electrodes to set the winding ratio and the manner of winding of the first inductor and the second inductor of the inductor component 10A, the inductance ratio between the primary coil L91 and the secondary coil L92 is able to be flexibly and easily set. Using the inductor component 10A enables the power supply module 94 to be used in applications designed for large current.

A conventional configuration of the isolated transformer TR requires consideration of the degree of coupling between the primary coil and the secondary coil made by a core, such as an EI or EE core, and requires adjustment during manufacture. Using the inductor component 10A makes it possible to achieve, without requiring such adjustment, a desired degree of coupling between the primary coil and the secondary coil.

Figure 9:
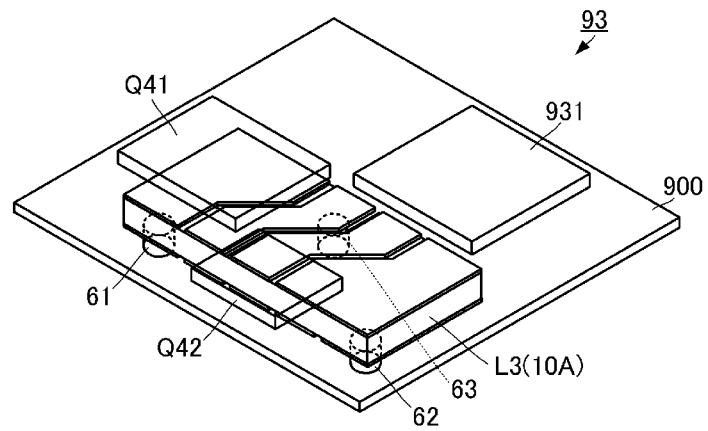
FIG. 9 is an external perspective view schematically illustrating a configuration of a power supply module according to a preferred embodiment of the present invention.

Each of the power supply modules described above may have a structure such as that illustrated in FIG. 9. FIG. 9 is an external perspective view schematically illustrating a configuration of a power supply module according to a preferred embodiment of the present invention. FIG. 9 only shows components which represent characteristic features of preferred embodiments of the present invention, and does not show the other components. Although FIG. 9 shows the power supply module 93, the same configuration is also applicable to the other power supply modules.

As illustrated in FIG. 9, the power supply module 93 includes a circuit board 900, the switching elements Q41 and Q42, the inductor component 10A, and the power supply control IC 931. The switching elements Q41 and Q42, the inductor component 10A, and the power supply control IC 931 are surface-mounted electronic components mounted on the surface of the circuit board 900. The circuit illustrated in FIG. 7 is obtained by mounting the switching elements Q41 and Q42, the inductor component 10A, the power supply control IC 931, and other components (not shown).

The terminal electrodes 61, 62, and 63 of the inductor component 10A are connected to conductor patterns on the surface of the circuit board 900. The switching element Q41 is connected to the conductor pattern to which the terminal electrode 61 is connected. The conductor pattern to which the terminal electrode 62 is connected is connected to the voltage output terminal Vout (not shown). The conductor pattern to which the terminal electrode 63 is connected is connected to the switching element Q42.

In plan view of the circuit board 900, at least a portion of the switching element Q41 and at least a portion of the switching element Q42 are superimposed on the inductor component 10A. The switching element Q41 and the switching element Q42 are disposed on the back side of the inductor component 10A. It is particularly preferable, as illustrated in FIG. 9, that the switching element Q42 is superimposed or substantially superimposed on the inductor component 10A.

This structure reduces the physical distance and the connection distance between the terminal electrode 63 of the inductor component 10A and the switching element Q42, and is able to improve the resistance of the power supply module 93 to noise. Also, the power supply module 93 is able to be reduced in size in plan view.

Although an inductor component is described above as being applied to a power supply module, it may be applied to an electric or electronic circuit component including a plurality of inductors.

For example, the inductor component 10A is applicable to a common mode choke coil. This may be achieved by a configuration which divides one of the first metal plate and the second metal plate, or a configuration which divides a metal pin or removes one of a plurality of metal pins. With this configuration of the inductor component, a common mode choke coil having good characteristics is able to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor component comprising:
   a core including an upper surface and a lower surface;
   a coil disposed in the core; and
   a first terminal electrode, a second terminal electrode, and a third terminal electrode; wherein
   the coil includes:
      a first metal plate disposed on the upper surface of the core;
      a second metal plate disposed on the lower surface of the core; and
      a plurality of metal pins passing through the core in a thickness direction;
   the coil has a helical shape by connecting the first metal plate to the second metal plate, with the plurality of metal pins therebetween; and
   the first terminal electrode, the second terminal electrode, and the third terminal electrode are spaced apart along a direction in which the helical shape of the coil extends, and are connected to the coil.

2. The inductor component according to claim 1, wherein the core is divided into a plurality of portions, which are spaced apart in a direction parallel or substantially parallel to the upper surface and the lower surface.

3. The inductor component according to claim 1, wherein the core is a single core.

4. The inductor component according to claim 1, wherein the first terminal electrode, the second terminal electrode, and the third terminal electrode are columnar electrodes connected to the second metal plate and extending in a direction orthogonal or substantially orthogonal to the lower surface of the core.

5. The inductor component according to claim 1, wherein the core has a rectangular or substantially rectangular parallelepiped shape.

6. The inductor component according to claim 2, wherein each of the plurality of portions of the core have a rectangular or substantially rectangular parallelepiped shape.

7. The inductor component according to claim 2, wherein a first side surface of one of the plurality of portions of the core is flush or substantially flush with a first side surface of another one of the plurality of portions of the core.

8. The inductor component according to claim 1, wherein
   the first metal plate is narrower on a side of a first side surface of the core than on a side of a second side surface of the core opposite to the first side surface; and
   the second metal plate is wider on the side of the first side surface of the core than on the side of the second side surface of the core.

9. The inductor component according to claim 1, wherein the coil includes a plurality of the first metal plates disposed on the upper surface of the core, and a plurality of second metal plates disposed on the lower surface of the core.

10. A power supply module comprising:
    the inductor component according to claim 1;
    a circuit board including a predetermined pattern provided thereon;
    a power supply control IC; and
    a switching element; wherein
    the inductor component, the power supply control IC, and the switching element are mounted on the circuit board;
    the switching element is disposed near one of the first terminal electrode, the second terminal electrode, and the third terminal electrode of the inductor component; and
    the switching element being connected to the one of the first, second, and third terminal electrodes.

11. The power supply module according to claim 10, wherein the switching element and the inductor component are at least partially superimposed in plan view.

12. The power supply module according to claim 10, wherein the core is divided into a plurality of portions, which are spaced apart in a direction parallel or substantially parallel to the upper surface and the lower surface.

13. The power supply module according to claim 10, wherein the core is a single core.

14. The power supply module according to claim 10, wherein the first terminal electrode, the second terminal electrode, and the third terminal electrode are columnar electrodes connected to the second metal plate and extending in a direction orthogonal or substantially orthogonal to the lower surface of the core.

15. The power supply module according to claim 10, wherein the core has a rectangular or substantially rectangular parallelepiped shape.

16. The power supply module according to claim 12, wherein each of the plurality of portions of the core has a rectangular or substantially rectangular parallelepiped shape.

17. The power supply module according to claim 12, wherein a first side surface of one of the plurality of portions of the core is flush or substantially flush with a first side surface of another one of the plurality of portions of the core.

18. The power supply module according to claim 10, wherein
    the first metal plate is narrower on a side of a first side surface of the core than on a side of a second side surface of the core opposite to the first side surface; and the second metal plate is wider on the side of the first side surface of the core than on the side of the second side surface of the core.

19. The power supply module according to claim 10, wherein the coil includes a plurality of the first metal plates disposed on the upper surface of the core, and a plurality of second metal plates disposed on the lower surface of the core.

* * * * *